US012195383B2

United States Patent
Hendriks (10) Patent No.: US 12,195,383 B2
(45) Date of Patent: Jan. 14, 2025

(54) CONTROLLED DEPOSITION OF A FUNCTIONAL MATERIAL ONTO A TARGET SURFACE

(71) Applicant: Nederlandse Organisatie voor toegepast-natuurwetenschappelijk onderzoek TNO, 's-Gravenhage (NL)

(72) Inventor: Rob Jacob Hendriks, Eindhoven (NL)

(73) Assignee: Nederlandse Organisatie voor toegepast-natuurwetenschappelijk onderzoek TNO, 's-Gravenhage (NL)

(*) Notice: Subject to any disclaimer, the term of this patent is extended or adjusted under 35 U.S.C. 154(b) by 115 days.

(21) Appl. No.: 17/915,290

(22) PCT Filed: Mar. 31, 2021

(86) PCT No.: PCT/NL2021/050209
§ 371 (c)(1),
(2) Date: Sep. 28, 2022

(87) PCT Pub. No.: WO2021/201681
PCT Pub. Date: Oct. 7, 2021

(65) Prior Publication Data
US 2023/0136483 A1 May 4, 2023

(30) Foreign Application Priority Data
Apr. 1, 2020 (EP) .................................... 20167549

(51) Int. Cl.
*B32B 7/02* (2019.01)
*C03C 17/34* (2006.01)
(Continued)

(52) U.S. Cl.
CPC ........ *C03C 17/3417* (2013.01); *C23C 14/081* (2013.01); *C23C 14/083* (2013.01);
(Continued)

(58) Field of Classification Search
CPC ............... H04L 25/0212; H04L 7/0062; C03C 17/3417; C03C 2217/734;
(Continued)

(56) References Cited

U.S. PATENT DOCUMENTS 6,177,151 B1 1/2001 Chrisey et al.
9,750,141 B2 8/2017 Noy
(Continued)

FOREIGN PATENT DOCUMENTS

EP 2843079 A1 3/2015
EP 2924718 A1 9/2015

OTHER PUBLICATIONS

European Patent Office, International Search Report in corresponding International Application No. PCT/NL2021/050209, dated Apr. 29, 2021 (2 pages).

*Primary Examiner* — Lawrence D Ferguson
(74) *Attorney, Agent, or Firm* — Leydig, Voit & Mayer, Ltd.

(57) ABSTRACT

A plate including functional material to be deposited onto a target surface using monochromatic radiation having a wavelength is described. The plate further includes a substrate with a first surface directed towards the target surface and with a second surface to receive the monochromatic radiation. The first surface is patterned with recessed areas that have a dielectric coating and that are filled with the functional material. The dielectric coating includes a sequence of dielectric coating layers alternating in refractive index. The dielectric coating therewith has a relatively high reflectivity for said monochromatic radiation incident perpendicular to the dielectric coating in comparison to a reflectivity for said monochromatic radiation incident at an angle of 45 degrees to the dielectric coating. As such shear forces are mitigated without requiring a high alignment
(Continued)

accuracy. The present application further describes a deposition device including the plate and a method involving the plate.

7 Claims, 8 Drawing Sheets

(51) Int. Cl.
    *C23C 14/08*          (2006.01)
    *C23C 14/10*          (2006.01)
    *C23C 14/28*          (2006.01)

(52) U.S. Cl.
    CPC .............. *C23C 14/10* (2013.01); *C23C 14/28* (2013.01); *C03C 2217/734* (2013.01); *C03C 2218/151* (2013.01)

(58) Field of Classification Search
    CPC ............ C03C 2218/151; C23C 14/081; C23C 14/083; C23C 14/10; C23C 14/28; C23C 26/00; C23C 26/02; C23C 28/00; C23C 28/04; C23C 28/042
    See application file for complete search history.

(56) References Cited

U.S. PATENT DOCUMENTS

| | | |
|---|---|---|
| 2009/0061112 A1 | 3/2009 | Kirmeier |
| 2011/0097550 A1 | 4/2011 | Matusovsky et al. |
| 2017/0013724 A1 | 1/2017 | Noy |
| 2017/0268100 A1 | 9/2017 | Hendriks et al. |
| 2018/0171468 A1 | 6/2018 | Hendriks et al. |

PRIOR ART

CONTROLLED DEPOSITION OF A FUNCTIONAL MATERIAL ONTO A TARGET SURFACE

CROSS-REFERENCE TO RELATED APPLICATIONS

This patent application is a U.S. National Phase of PCT International Application No. PCT/NL2021/050209, filed Mar. 31, 2021, which claims priority to European Application No. 20167549.3, filed Apr. 1, 2020, which are both expressly incorporated by reference in their entireties, including any references contained therein.

BACKGROUND

The present application pertains to a method for controlled deposition of a functional material onto a target surface.

The present application further pertains to a plate comprising a functional material to be deposited onto a target surface.

The present application still further pertains to a deposition device comprising such a plate.

According to one approach the functional material to be deposited is provided as a continuous layer at a first side of a substrate and the layer is locally ablated by a laser beam directed via the substrate to the layer. Examples thereof are US 2009/061112 A1, EP 2 924 718 A1, EP 2 843 079 A1, U.S. Pat. No. 6,177,151 B1.

According to another approach, the functional material to be deposited is not present as a continuous layer, but is present in recessed areas of the source substrate. A method for controlled deposition of a functional material onto a target surface according to this approach is known from US2017268100. According to the method disclosed therein, an optically transparent plate having a first surface with one or more wells and a second surface opposite the first surface is provided. After coating the first surface with a thin layer of light-absorbing material, the wells are filled with a functional material. The plate is then irradiated from the second surface with a pulsed light to induce heat in the well and in order to generate gas to transfer the functional material from the well onto a receiving substrate located adjacent to the plate. In this process, the heat flux around the well will determine how the functional material is be ejected.

Figure 1:
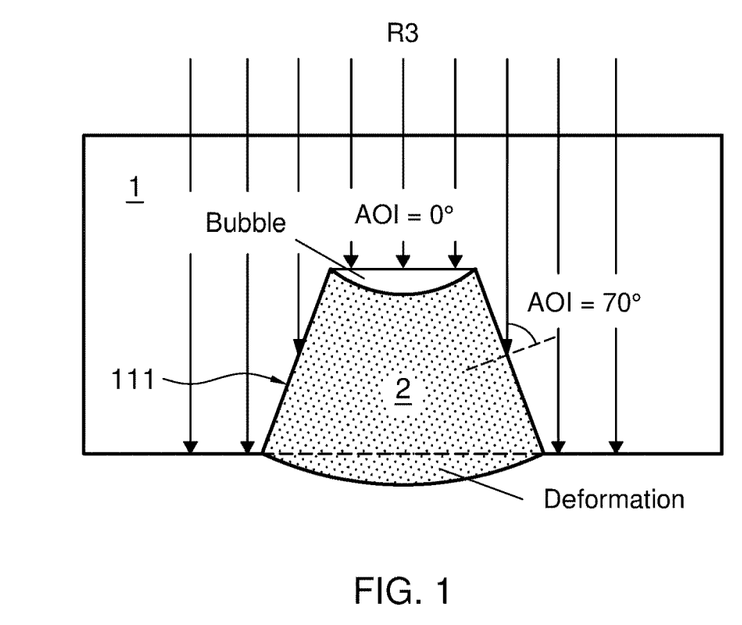
Figure 1A:
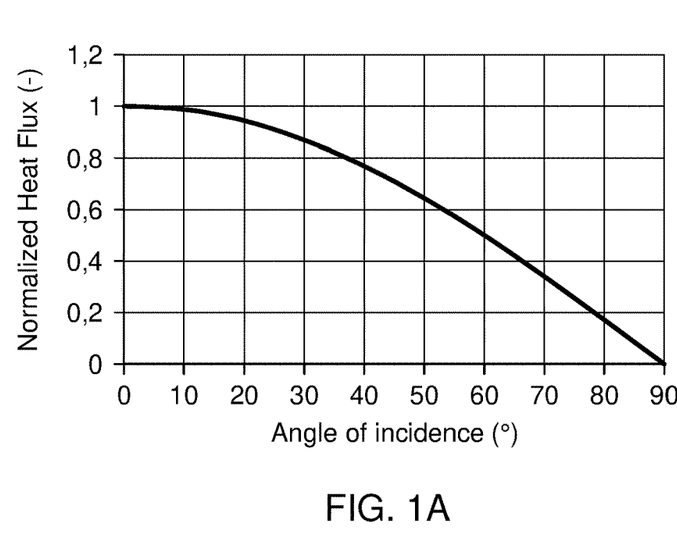

As shown schematically in FIG. 1, typically sidewalls of a well 111 are slanted with respect to the direction of the normal of the plate. As shown in FIG. 1A, the power density (heat flux) of the light computed for the surface of the sidewall is therewith proportional to the cosine of the angle of the side wall with respect to the bottom of the well. Hence, when in the known method, a focused or collimated laser beam illuminates a well from the second surface, the sidewalls of the well will have a lower power density because of the higher angle of incidence. For example, when a sidewall is slanted with respect to the bottom at an angle of 70° then the power density and therewith the heat flux in the plane of the sidewall will almost be 3 times lower in comparison to the power density at the bottom of the well. This implies that heat induction at the side walls of the well is substantially less than at the bottom of the well. As a consequence, the pressure exerted on the functional material has a substantial non-homogeneous distribution, so that the functional material will undergo significant shear forces during the transfer process, especially when using high viscous functional materials. Although beam shaping is an option to control the heat flux on side walls, it becomes significantly more difficult for small spot sizes. Also aligning the shaped beam onto the small wells will require a high accuracy system. This approach becomes even more complicated if the wells are of a different size and shape. In that case it would be necessary to dynamically adapt the beam shape to the shape of the well that is targeted.

SUMMARY

It is an object of the present application to provide an improved method wherein shear forces are mitigated without requiring a high alignment accuracy. In accordance therewith a method is provided as claimed in claim 1.

It is a further object of the present application to provide an improved plate for use in the improved method. In accordance therewith a plate is provided as claimed in claim 8.

It is a still further object of the present application to provide an improved deposition device wherein shear forces are mitigated without requiring a high alignment accuracy. In accordance therewith a deposition device is provided as claimed in claim 15.

The improved method for controlled deposition of a functional material onto a target surface using monochromatic radiation having a wavelength as claimed in claim 1 comprises the following steps.

A transparent carrier plate is provided that has a substrate with a first and a second mutually opposite surfaces. The first surface of the substrate is therewith provided with one or more recessed areas. The substrate may be provided of any transparent material, e.g. glass or silicon oxide and the one or more recessed areas can be provided therein with any method, e.g. by etching.

A dielectric coating is deposited on the first surface. Therewith in subsequent steps a plurality of dielectric coating layers is deposited wherein each next dielectric coating layer has a refractive index different from the refractive index of the previous dielectric coating layer. I.e. alternating a dielectric coating layer with a relatively low refractive index and a dielectric coating layer with a relatively high refractive index are deposited in this stage. The dielectric coating layers are deposited in a manner conformal to the first surface of the substrate provided with the one or more recessed areas, so that a thickness of the dielectric coating layers measured in the direction of the local surface normal is substantially uniform. For practical purposes the dielectric coating is deposited over the entire first surface. This however not essential. It is sufficient that the dielectric coating is present at the first surface inside the one or more wells, including their bottom and side walls. Typically chemical vapour desposition (CVD) or atomic layer deposition (ALD) techniques are used to deposit these thin layers with well-defined thicknesses that conform to the surface.

The dielectric layers have a thickness in the range for which the dielectric coating has a relatively high reflectivity for said monochromatic radiation incident perpendicular to the dielectric coating in comparison to a reflectivity for said monochromatic radiation incident at an angle of 45 degrees to the dielectric coating. In an embodiment, the dielectric coating layers have a thickness in the range of 0.05 to 0.15 times the wavelength of the monochromatic photon radiation. Therewith a risk of damage due to thermal stress is mitigated. Also for this purpose, it is preferred that absorption of the monochromatic radiation in the dielectric coating is as low as possible, e.g. less than 10%, more preferably less than 5% and still more preferably less than 2%

Subsequent to the one or more recessed areas are filled with a functional material. Filling can take place directly after the deposition of the dielectric coating, but alternatively other process steps may intervene. The dielectric coating may for example be provided with a protective layer, e.g. a scratch resistant layer.

In use the transparent carrier plate is positioned between a monochromatic radiation source and the target surface of a target. Therewith the plate faces the target surface with its first surface.

Monochromatic radiation is then directed towards the second surface of the plate. The monochromatic radiation has an intensity and a duration that causes a transfer of functional material from the one or more recessed areas to the target surface. Monochromatic radiation entering a bottom of a well transfers the dielectric coating in an at least substantially orthogonal direction. Therewith its intensity is reduced due to the relatively high reflectivity of the dielectric coating for the monochromatic radiation in this direction. Monochromatic radiation entering a side wall of a well transfers the dielectric coating in an angle that substantially deviates form the at least substantially orthogonal direction. The dielectric coating has a reduced reflectivity for the monochromatic radiation incident with this deviating angle, so that a larger portion thereof is transmitted through the coating. Therewith it is achieved that a more homogeneous distribution of the heat flux is obtained and therewith shear forces acting on the functional material to be transferred and deposited are mitigated.

In the absence of shear forces functional substances can be transferred with extremely high viscosities. This has the advantage that the functional substance does not spread on impact and that high resolution structures with a high aspect ratio are possible. Also this enables the transfer process to take place at a larger distance between the first surface of the plate and the target surface. The bigger the transfer gap, the easier it is to implement this technology as the tolerances for the machine are less demanding. Furthermore, a large transfer gap facilitates printing on uneven surfaces, for example on rough surfaces or on 3D surfaces. Therewith this technology is also suitable for 3D printing of electrical interconnects. By way of example the viscosity of the is in a range of 100-1000 Pa·s.

It is sufficient that the beam of monochromatic radiation is substantially uniform in the environment of the well. Therewith it is not necessary that the beam is accurately shaped and aligned with the walls in accordance with the recessed areas. In some embodiments the monochromatic radiation source is an excimer laser. In other embodiments the monochromatic radiation source is a scanning laser. In some of these other embodiments the monochromatic photon radiation is directed via a telecentric lens to the second surface of the plate to ensure that the angle of incidence is equal over the area covered by the monochromatic radiation. It is noted that a substantially uniform exposure with monochromatic radiation is achieved if the monochromatic radiation is scanned with a substantially constant velocity in the scanning direction and the integral of the beam intensity in the scanning direction is substantially constant in the direction transverse to the scanning direction within the region of the well. Typically, the monochromatic irradiation is provided as a large area spot with a excimer laser to illuminate a full pattern at the same time. Therewith scanning is not required. For example using a laser spot size of 1×1 to 10×10 mm$^2$ (larger than the entire patterns itself) to transfer high resolution interconnects patterns at once. In this case a pulse overlap would not be needed.

In some embodiments, a photon radiation absorbing layer is deposited subsequent to the step of depositing the dielectric coating, and preceding the step of filling the one or more recessed areas with the functional material. It is achieved therewith that the monochromatic photon radiation transmitted through the dielectric coating is very efficiently converted in heat. This is in particular useful if the functional material to be deposited has a relatively high reflectivity or transmission for the monochromatic photon radiation. In some of these embodiments the material of the photon radiation absorbing layer evaporates upon absorbing the monochromatic photon radiation and therewith contributes to or causes the development of the vapor pressure that is to expel the functional material from the recessed area. In other embodiments a dedicated material to be evaporated may be provided in the recessed area.

In some embodiments non-recessed portions of the first surface of the plate are provided with a reflective coating that substantially reflects the monochromatic radiation. Therewith it is achieved that functional material (if any) present outside the recessed areas is not accidentally deposited at the target surface when the monochromatic photon radiation beam extends beyond the boundary of the recessed area. Functional material could incidentally be present outside the recessed area as a remainder. Also it may be desired to provide the entire first surface of the plate with the functional material to simplify the manufacturing process of the plate. In terms of manufacturing a printing plate with an increased reflection outside of the recessed area a different mirror stack is required as compared to that inside the recessed areas. The easiest way to realize this is to add a coating with one or more coating layers before the recessed areas are formed in the plate so that no alignment is required during manufacturing. The added coating should increase the reflection after the dielectric coating is deposited. that is to provide for a homogeneous distribution of heat flux over the inner wall of the recessed areas.

As becomes apparent from the above, the improved plate suitable for the improved deposition process comprises a functional material to be deposited onto a target surface using monochromatic photon radiation having a wavelength. The improved plate comprises a substrate with a first surface to be directed towards the target surface and with a second surface to receive the monochromatic photon radiation. The first surface of the plate is patterned with one or more recessed areas having a dielectric coating and being filled with the functional material, wherein the dielectric coating comprises a sequence of dielectric coating layers alternating in refractive index. The dielectric coating has a relatively high reflectivity for monochromatic radiation incident perpendicular to the dielectric coating in comparison to a reflectivity for said monochromatic radiation incident at an angle of 45 degrees to the dielectric coating. As noted above it is sufficient that the dielectric coating extends over the portions of the first surface defined by the bottom and the sidewalls of the recessed areas, but the dielectric coating may additionally extend outside the recessed areas, e.g. cover the entire first surface area of the plate.

In embodiments, the plate is provided at its second surface with a gray-scale mask to control a heat flux of the monochromatic photon radiation. In some examples of these embodiments the gray-scale mask cooperates with the dielectric coating at the second surface of the plate to provide for an at least substantially homogeneous transmitted heat flux at the inner surface of the one or more recessed areas. In this way an additional degree of freedom is available to control the transmitted heat flux. For example, on a larger scale the gray-scale mask can be used to control the release time (different heat fluxes) of certain patterns. For example, when transferring a line, it can be used to provide for a reduced or increased heat flux on the ends of the line to control how the functional material ejects.

In other examples of these embodiments, the gray-scale mask is provided to suppress transmission of said radiation outside these areas. In again other examples of these embodiments the gray-scale mask combines these functionalities. The gray-scale mask may control the heat flux by absorbing and/or reflecting the radiation according to a spatial pattern. It is noted that other embodiments are conceivable, wherein a gray-scale mask is provided as a separate element, that is positioned between the radiation source and the plate. It is advantageous however that the gray-scale mask is integrated with the plate in that therewith separate positioning and alignment steps are avoided.

Having the gray-scale mask integrated with the plate is further advantageous, in that it enables control of the heat-flux at a finer level of detail., e.g. at a resolution of less than 10 micron. For very precise additional heat flux control using a gray-scale mask it may be desired to provide the gray-scale mask at the same side of the substrate as the dielectric coating, e.g. between the substrate and the dielectric coating.

The improved deposition device comprises in addition to the improved plate the following elements.

A holder to hold a target with a target surface facing the first surface of the plate. The target surface is to receive the functional material A monochromatic photon radiation source is provided to render the monochromatic photon radiation that is to be directed towards the second surface of the plate.

A controller is to cause the monochromatic radiation source to render the monochromatic photon radiation with an intensity and a duration that causes a transfer of functional material from the one or more recessed areas to the target surface.

In some embodiments the monochromatic photon radiation source is an excimer laser that generates a beam with a uniform intensity distribution. In other embodiments a scanning laser is used to generate the monochromatic radiation. In some of these other embodiments the monochromatic radiation is directed via a telecentric lens to the second surface of the plate to ensure that the angle of incidence is equal over the area covered by the monochromatic radiation. In an embodiment the controller is further configured to control the movement of a scanning path of the scanning laser. Alternatively or additionally, the controller may control a position of the holder for carrying the target.

BRIEF DESCRIPTION OF THE DRAWINGS

These and other aspects are described in more detail with reference to the drawings. Therein FIG. 1, 1A schematically shows a stage in a prior art deposition process.

DETAILED DESCRIPTION OF EMBODIMENTS

Figure 2:
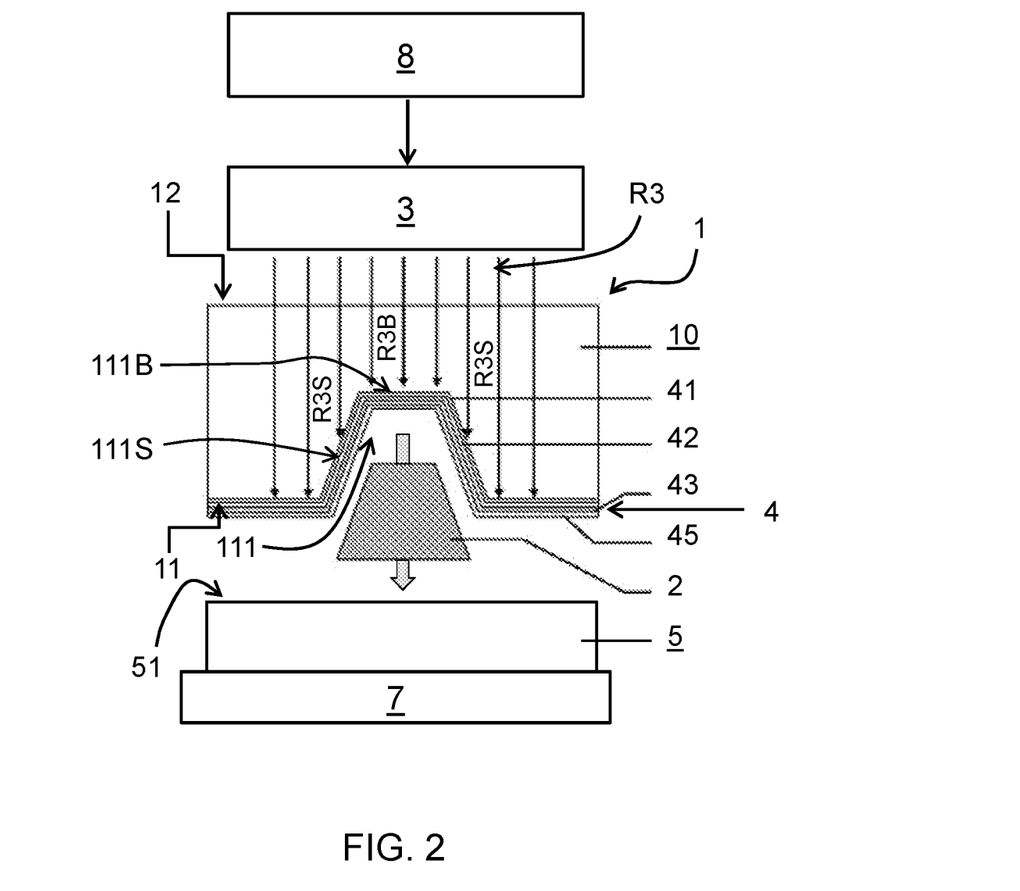
FIG. 2 shows an embodiment of a deposition device including a plate as claimed herein.

FIG. 2 schematically shows a deposition device to controllably deposit a functional material 2 onto a target surface 51 of a target 5 using monochromatic radiation R3 having a wavelength $\lambda_{R3}$. The deposition device of FIG. 2 comprises a carrier plate 1, a holder 7 to hold the target 5, a monochromatic photon radiation source 3 and a controller 8 to control the monochromatic radiation source 3.

As schematically shown in FIG. 2, the carrier plate 1 has a substrate 10 with a first surface 11 to be directed towards the target surface 51 and a second surface 12 to receive the monochromatic photon radiation R3. The first surface 11 is patterned with one or more recessed areas 111. In the example of FIG. 2 only one recessed area 111 is shown, but in practice, the carrier plate 1 may have a plurality of recessed areas. Recessed areas may be of any type, e.g. circular wells, curved or straight trenches and the like. The recessed areas may for example have a width of 10 micron and smaller, but also larger sized recessed areas may be contemplated depending on the application. In the example shown in FIG. 2, the entire first surface 11 provided with a dielectric coating 4. Alternatively, the dielectric coating 4 may be exclusively provided in the portions of the first surface 11 defined by the recessed area(s) 111, and be absent outside these areas. The recessed areas 111 are filled with the functional material 2 to be deposited on the target. As schematically shown further in FIG. 2, the dielectric coating 4 comprises a sequence of dielectric coating layers 41, 42, 43 that alternate in refractive index. The dielectric coating layers 41, 42, 43 are applied with a uniform thickness so that the dielectric coating 4 has a relatively high reflectivity for monochromatic radiation R3B incident thereto in a perpendicular direction and has a relatively low reflectivity for monochromatic radiation R3S incident thereto in a direction deviating from said perpendicular direction, i.e. at an angle of 45 degrees.

In operation of the deposition device the controller 8 causes the monochromatic radiation source 3 to render monochromatic photon radiation R3 with an intensity and a duration that causes a transfer of functional material 2 from the one or more recessed areas 111 to the target surface 51. The monochromatic radiation source 3 directs the monochromatic radiation R3 towards the second surface 12 of the carrier plate 1. To that end the monochromatic radiation source 3 may include a laser, e.g. an excimer laser or a scanning laser and optional further optical components, such as a telecentric lens.

As shown schematically in FIG. 2, for monochromatic radiation R3B directed towards the bottom 111B of the recessed area 111 is incident to the dielectric coating 4 in a perpendicular direction so that a relatively large portion is reflected. Contrary thereto monochromatic radiation R3S directed towards the side wall 111S of the recessed areas 111 is incident to the dielectric coating 4 in a direction deviating from the perpendicular direction, so that only a relatively small portion thereof is reflected. Therewith the radiation intensity at the bottom 111B of the recessed area(s) 111 is reduced as compared to the case wherein a dielectric coating 4 is absent. As a consequence a difference between the heat flux developed near the sidewall 111S and the bottom 111B is reduced.

Figure 3A:
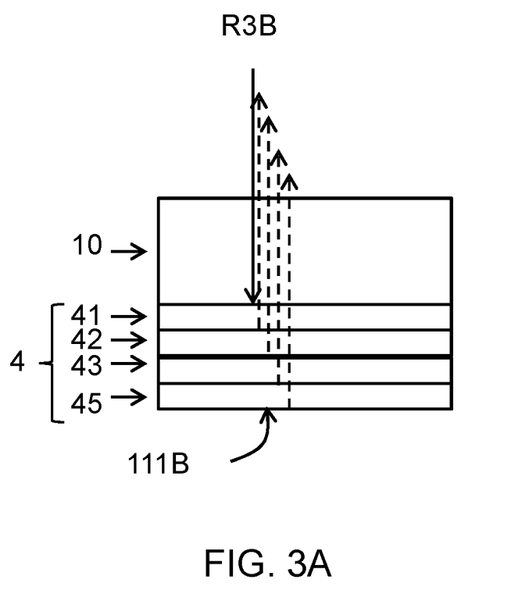
FIG. 3A, 3B illustrate aspects of the plate.
Figure 3B:
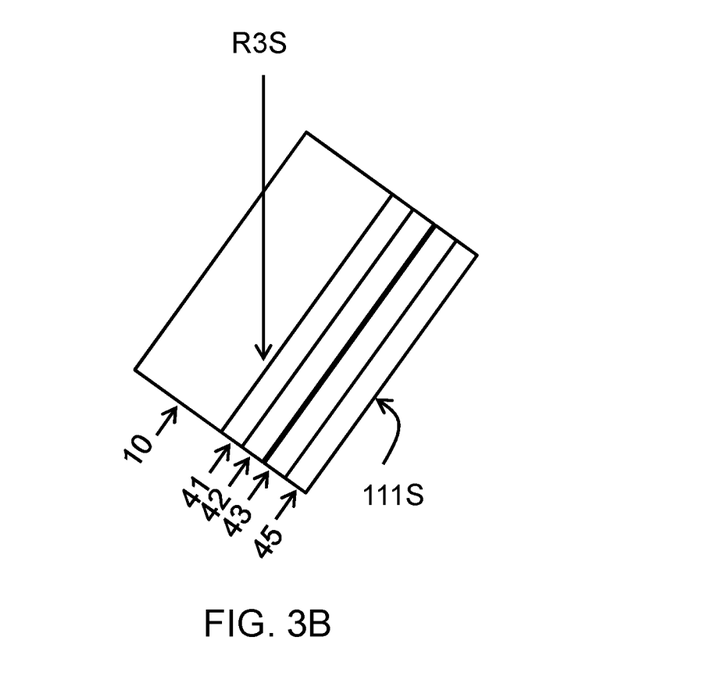

A first example is shown in more detail in FIG. 3A, 3B. Therein FIG. 3A shows a portion of the bottom 111B of a recessed area 111, and FIG. 3B shows a portion of the side wall 111S of a recessed area 111. In the example shown the substrate 10 of the plate is of silicon dioxide, and a dielectric coating 4 is provided with a first high refractive index (n=2.4) layer 41 of TiO2 with a thickness of 40 nm, a first low refractive index (n=1.45) layer 42 of SiO2 with a thickness of 40 nm, and a second high refractive index layer 43 of TiO2 with a thickness of 40 nm. Also a protective coating layer 45 of Al2O3 with a thickness of 40 nm is provided. The latter has a refractive index n=1.75.

It is noted that in dielectric mirrors the thickness of the layers multiplied with their refractive index is typically a quarter of the wavelength of the radiation to be reflected, so that the high refractive index layers are thinner than the layers with a lower refractive index. In the present application it is not necessary that the dielectric coating reflects all radiation, but it is sufficient that the radiation directed towards the bottom of the recessed portions is attenuated to a sufficient extent to achieve a substantially homogeneous distribution of the transmitted heat flux over the inner surface of the recessed areas. Suitable coatings that meet this requirement can selected without undue effort using a simulation. For example starting from the following input, a wavelength $XR_3$ of the monochromatic radiation used, a slanting angle of the walls of the recessed elements a number of dielectric layers in the dielectric coating and a selection of the mutually different dielectric materials for these layers, the thickness can be varied in the simulation to determine for which thickness the required attenuation is achieved. It can be presumed in the simulation that the thickness of the layers is equal, or that the layer thicknesses for high- and low refractive index layers mutually have a fixed thickness ratio. Therewith only one parameter needs to be varied in the simulation. https://www.filmetrics.com/reflectance-calculator provides a simulator suitable for this purpose.

At each interface 10-41, 41-42, 42-43 and 43-45 and 45, a reflection occurs and these reflections reinforce or cancel each other depending on the path length difference. The path length through each layer is the product of the layer thickness (d) and its refractive index (n).

The strength of the reflection at the interface of mutually subsequent layers depends on their refractive indices ($n_o$, $n_s$) according to the following relationship.

$$R = \left(\frac{n_0 - n_S}{n_0 + n_S}\right)^2$$

The extent to which reflections mutually cancel each other depends on their phase difference.

In an example, the wavelength $\lambda_{R3}$ of the monochromatic radiation source used is 532 nm. Therewith for the layers 41, 42, 43, 45 the bidirectional optic path length (*$\lambda_{R3}$) for radiation incident in the direction of the surface normal expressed as a fraction of the wavelength is as follows:

| Layer | Material | n.d | *$\lambda_{R3}$ |
|---|---|---|---|
| 41, 43 | TiO2 (n = 2.4) | 96 | 0.36 |
| 42 | SiO2 (n = 1.45) | 58 | 0.22 |
| 45 | Al2O3 (n = 1.75) | 70 | 0.26 |

In the center of the recessed area, the incident angle of the light is transverse to the plane of the layers. The various partial reflections are out of phase but are not fully in counter phase, so that part of the radiation R3B is reflected, and does not arrive at the bottom 111B of the recessed area 111.

In the case of FIG. 3B, showing the radiation R3S directed to the side wall 111S of the recessed areas 111, the path length is increased, as the radiation R3S has a direction deviating from the normal direction of the coating 4. Therewith the partial reflections occurring at the layer interfaces are to a larger extent out of phase, so that a relatively small part of the radiation R3S is reflected. Therewith a larger part can reach the side wall 111S of the recessed area 111.

Figure 4:
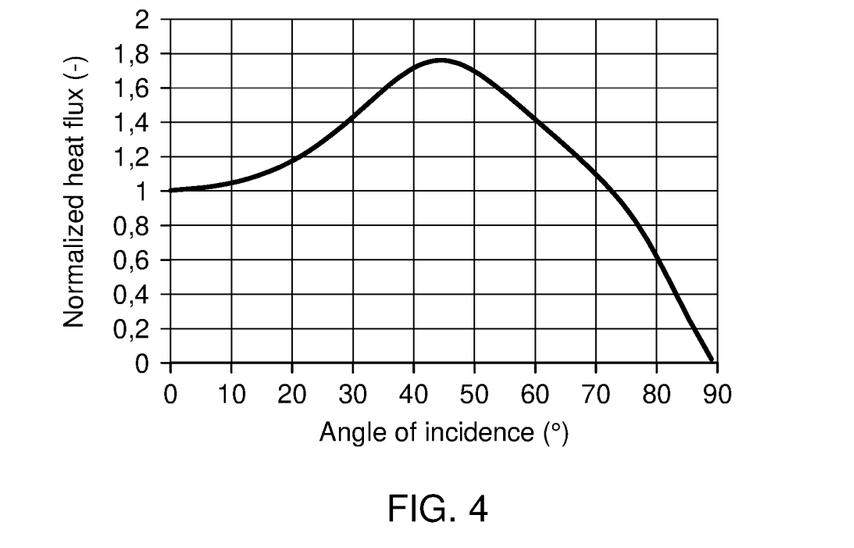
FIG. 4 schematically shows a normalized transmitted heat flux as a function of a wall angle in a first embodiment of the plate.

FIG. 4 shows the relationship between the normalized heatflux (normalized power density) and the angle of incidence of the beam. In this example, the normalized heatflux gradually increases from about 1 to 1.8 when increasing the angle from 0 to 45 degrees, and decreases to 0 when the angle is further decreased to 90 degrees. For an angle of 70 degrees, corresponding to the angle of the sidewall the 111S, the normalized heatflux is approximately equal to 1, so that a substantially uniform heatflux is achieved within the recessed area 111. It is noted that the heat flux transmitted through a surface is defined as the power density (W/m²) in the normal direction of the surface. The normalized heat flux is a dimensionless value obtained by dividing the heat flux for a particular angle by the heat flux at an angle of 0. In some cases, it may be desired that the heat flux through the side walls of the recessed area is slightly higher (e.g. about 5 or 10%) than the heat flux through the bottom, so that the side releases just before the bottom releases. Therewith a risk of occurrence of a shear force can be further mitigated.

In another example, the wavelength $\lambda_{R3}$ of the monochromatic radiation source used is 308 nm and the dielectric coating 4 is provided with a first high refractive index (n=2.1) layer 41 of HfO2 with a thickness of 38 nm, a first low refractive index (n=1.45) layer 42 of SiO2 with a thickness of 38 nm, and a second high refractive index layer 43 of HfO2 with a thickness of 38 nm. Also a protective coating layer 45 of Al2O3 with a thickness of 25 nm is provided. The latter has a refractive index n=1.75.

| Layer | Material | n.d | *$\lambda_{R3}$ |
|---|---|---|---|
| 41, 43 | HfO2 (n = 2.1) | 55 | 0.36 |
| 42 | SiO2 (n = 1.45) | 80 | 0.51 |
| 45 | Al2O3 (n = 1.75) | 44 | 0.28 |

Figure 5:
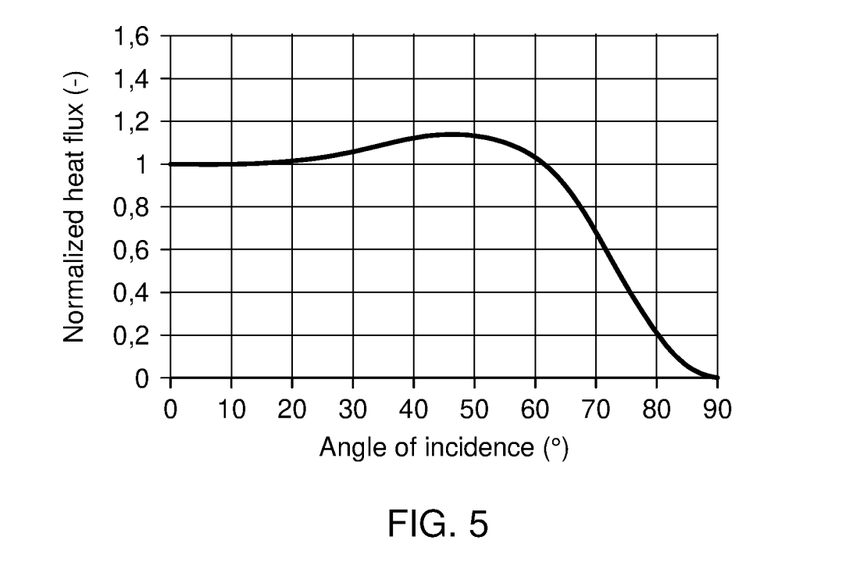
FIG. 5 schematically shows a normalized transmitted heat flux as a function of a wall angle in a second embodiment of the plate.

FIG. 5 shows for this example the normalized heat flux as a function of the angle of incidence. The dependency of the normalized heat flux on the angle of incidence is qualitatively the same as in preceding example, but quantitatively there is a difference. With an angle in a range of 0 to about 65 degrees, the normalized heat flux does not differ more than about 10% from the reference value 1. Therewith recessed areas 111 with a variety of side wall angles within this range of angles can be provided in the carrier plate, all having a substantially uniform distribution of heat flux over their bottom wall and side wall.

Figure 6:
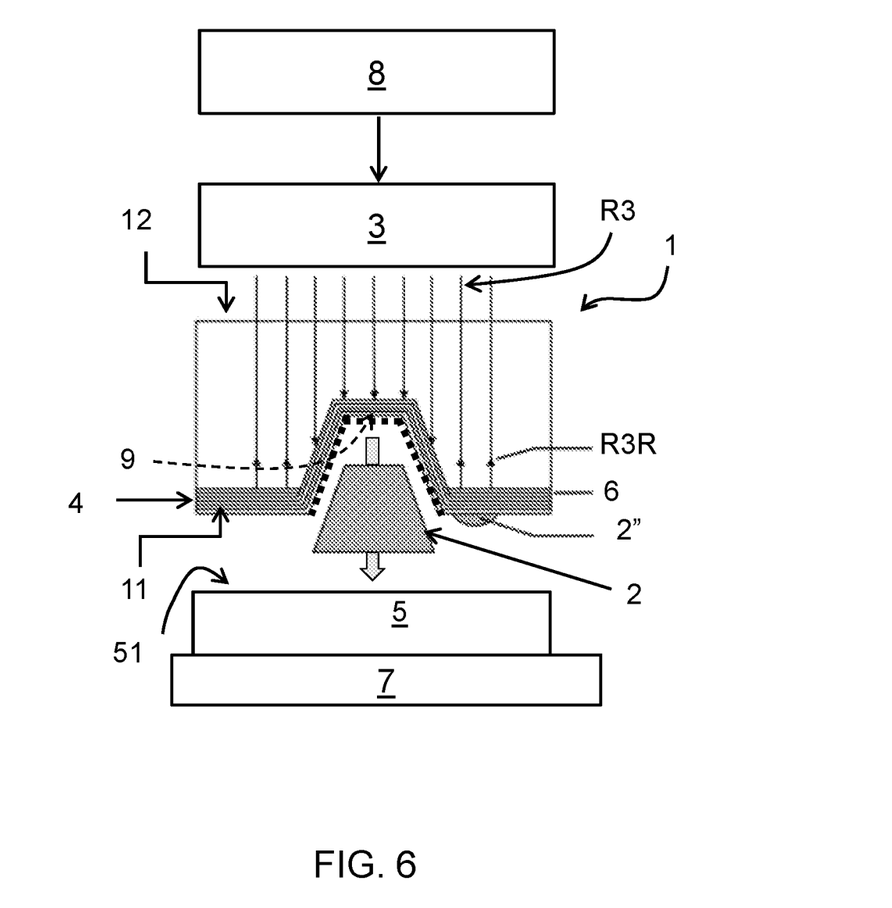
FIG. 6 shows another embodiment of a deposition device including a plate as claimed herein.

FIG. 6 shows an alternative embodiment of the claimed deposition device. Parts therein corresponding to those in FIG. 2 have the same reference. As an additional feature the non-recessed portions of the first surface 11 of the carrier plate are provided with a reflective coating 6, e.g. a reflecting metal coating or a further dielectric coating 6 that substantially reflects (R3R) the monochromatic radiation R3. The dielectric coating 4 extending over the further dielectric coating 6 can therewith cooperates with the latter. This is because the dielectric coating 4 is already designed to partially reflect incident radiation perpendicular to the surface. The further dielectric coating 6 below the dielectric coating 4 provides additional dielectric coating layers that further enhance the reflectivity outside the recessed areas.

Therewith it is avoided that any functional material 2" present in these areas is transferred to the target surface 51, even if the monochromatic radiation R3 is directed thereto. It is not necessary that a reflective coating 6 fully reflects the radiation R3. It is sufficient if the monochromatic radiation R3 is sufficiently reduced in strength to avoid the transfer.

In the embodiment shown in FIG. 6 the recessed area 111 is further provided with a photon radiation absorbing layer 9 between the dielectric coating 4 and the functional material 2. Therewith the photon radiation is very efficiently converted into heat, regardless the type of functional material 2 used.

Figure 7:
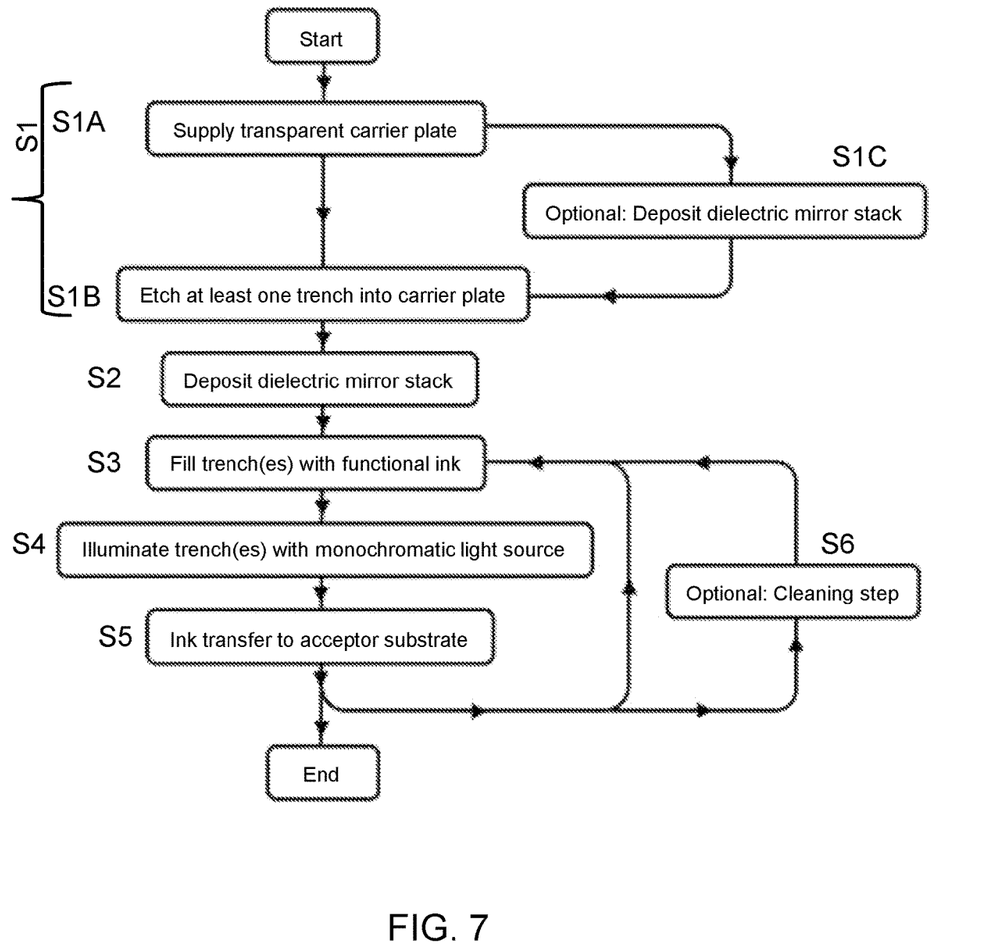
FIG. 7 shows an embodiment of a method as claimed herein.

FIG. 7 schematically shows a method for controlled deposition of a functional material onto a target surface using monochromatic radiation having a wavelength. The method comprises a step S1, wherein a transparent carrier plate is provided having a substrate with a first and a second mutually opposite surfaces, therewith providing the first surface with one or more recessed areas. In an embodiment step S1 comprises a first sub-step S1A, wherein the transparent carrier plate is provided, e.g. made of glass or silicon oxide, and a second sub-step S1B, wherein the first surface is provided with one or more recessed areas.

In the embodiment of FIG. 7, an additional sub-step S1C is performed. In this sub-step S1C, a reflective coating is deposited at the first surface that substantially reflects the monochromatic radiation incident perpendicular to the reflective coating. Sub-step S1C comprises for example depositing a reflecting metal coating, e.g. a silver layer. Preferably however a dielectric coating is applied using a sequence of sub-sub-steps wherein dielectric coating layers are subsequently deposited to form a dielectric mirror that (optionally in combination with a dielectric coating 4) substantially reflects perpendicularly incident monochromatic radiation of said wavelength. With a dielectric mirror an amount of heat absorption van be relatively modest as compared to when using a metal coating, therewith reducing the risk of damage. In the example of FIG. 7, sub-step S1C is performed before providing in step S1B the first surface with one or more recessed areas. As a result, a plate is obtained as used in the deposition device of FIG. 6, wherein non-recessed portions of the first surface 11 of the plate 1 are provided with a reflective coating 6 that substantially reflects the monochromatic radiation R3. As discussed with reference to FIG. 6, therewith the risk that materials are unintendedly transferred outside the recessed portions is reduced. Because in this embodiment of the method sub-step S1B is performed subsequent to sub-step S1C, it is not necessary to accurately align the deposition process in sub-step S1C. In sub-step S1C, the dielectric coating 6 or other reflective coating can simply be deposited over the entire first surface of the plate, and in sub-step S1B this coating is locally removed in the portions of the first surface occupied by the recessed portions. Nevertheless, it may be contemplated to perform sub-step S1C subsequent to sub-step S1B provided that care is taken that the first surface occupied by the recessed portions remains free from the material used for the reflective coating.

In step S2 of the method, a dielectric coating is deposited Step S2 comprises a sequence of sub-steps wherein in each subsequent sub-step a dielectric coating layer is deposited having a refractive index different from that of the dielectric coating layer deposited in the preceding sub-step. It is sufficient that the dielectric coating obtained therewith extends within the portions of the first surface defined by the one or more recessed areas, but alternatively the dielectric coating may also extend beyond the one or more recessed areas. Typically the dielectric coating is deposited over the entire surface of the plate, therewith obviating masking and aligning issues.

The dielectric coating has a reflectivity for the monochromatic radiation incident perpendicular thereto that is relatively high in comparison to a reflectivity for said monochromatic radiation incident at an angle of 45 degrees to the dielectric coating.

In a subsequent step S3 the one or more recessed areas are filled with the functional material, e.g. copper, aluminum, tungsten, chromium, polysilicon to be deposited. Other materials than metal are also suitable for use as a functional material. The functional material may for example be provided as an ink wherein conductive particles are suspended. Rheological properties of the functional material may be modified by additives or solvent, for example to obtain a shear-thickening, a shear-thinning, a thixotropic, a rheopectic or a Bingham plastic behavior. In particular donor materials with a shear-thinning behavior are favorable. Donor materials with this behavior have a viscosity that decreases with the rate of shear strain. Shear-thinning donor materials remain as a stable layer on the donor substrate, but are relatively easily morphed at the time of deposition. By way of example, the functional material is a viscous silver nanoparticle ink with a high metal load.

It is noted further process steps may take place before the one or more recessed areas are filled with the functional material. For example a photon radiation absorbing layer may be deposited subsequent to the step of depositing the dielectric coating, and preceding the step of filling the one or more recessed areas with said functional material. As noted above this improves the conversion of the monochromatic radiation into heat. Alternatively or additionally a vaporizable material may be deposited the one or more recessed areas before filling with the functional material.

After the one or more recessed areas are filled in step S3 with the functional material, the transparent carrier plate is ready for use in a deposition device, for example as shown in FIG. 2 or FIG. 6.

Therewith the transparent carrier plate 1 is positioned between the monochromatic radiation source 3 and the target surface 51 of a target, with the first surface 11 facing the target surface 51, as shown in FIGS. 2 and 6 for example.

In operation the monochromatic radiation R3 of the monochromatic radiation source 3 is directed in step S4 towards the second surface 12 of the plate 1. Therewith the monochromatic radiation R3 has an intensity and a duration that causes a transfer S5 of functional material 2 from the one or more recessed areas 111 to the target surface 51. Optimal values for intensity and duration can be determined by routine tests for a selected functional material and the transmissivity of the coating layers. The duration of the heat irradiation is typically short, e.g. in terms of microseconds, usually even shorter, nano-seconds. In practice good results with modest technical requirements may be obtained with a pulse duration in the order of a few to a few tens of ns. Nevertheless, in some cases an even shorter pulse duration may be applied, e.g. in the range of 10-500 ps. In a test phase the intensity can be varied from a relatively low value (e.g. corresponding to an exposure (fluence) of about 0.1 J/cm$^2$) to a relatively high value (e.g. corresponding to an exposure (fluence) of about 1 J/cm$^2$) to determine for which value or value range the transfer of the functional material 2 is optimal in terms of deposition accuracy.

According to one approach, the entire second surface 12 of the plate 1 is irradiated with a beam of homogeneous power density. In that case a homogeneous exposure is achieved having an exposure value equal to the product of the power density and the exposure time.

Figure 8:
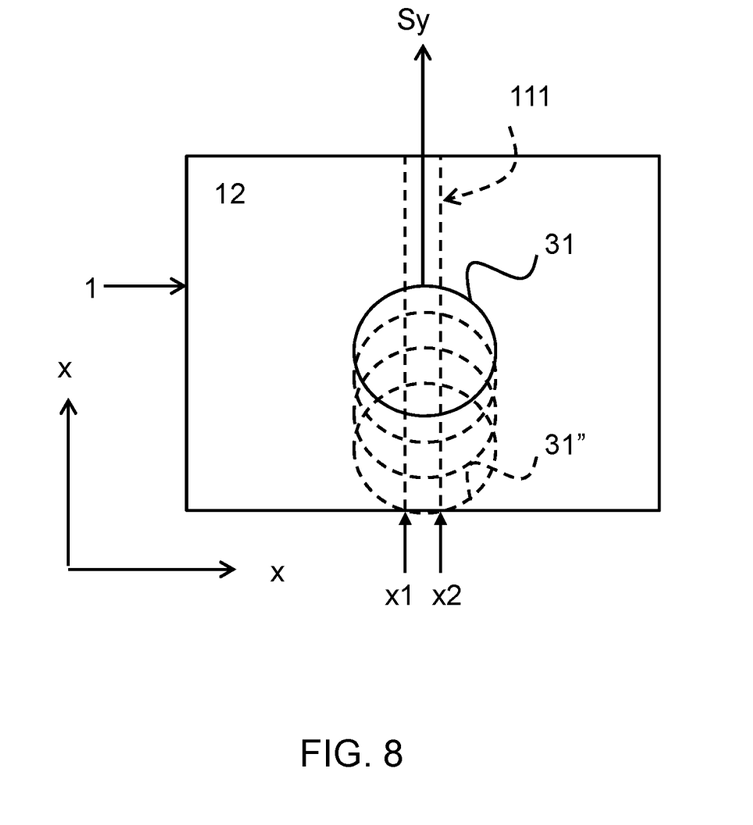
FIG. 8 schematically shows exemplary aspects of the method.

According to another approach, as illustrated in FIG. 8, a scanning beam is used that is scanned with a speed v in a scanning direction Sy, parallel to axis y, along the second surface 12 opposite the recessed area 111 (here a trench shown in dotted lines) at the first surface.

In this case, the exposure E(x,y) can be determined as:

$$E(x,y) = \int_{t=-\infty}^{+\infty} P(x,y,t)Q(t)dt$$

Wherein P(.,.,.) specifies the spatial distribution of the beam R3 and Q( ) specifies how the total beam power varies in time t.

FIG. 8 shows the footprint 31 of the scanning beam when it is pulsed during scanning. Previous pulses are indicated as dotted circles, e.g. 31". As a result of said scanning, uniformity of the energy density at the second surface is obtained in the scanning direction provided that the distance between subsequently pulsed areas 31", 31 is subsequently small, e.g. the distance should be smaller than one third times the size of the footprint in the scanning direction. Also in the direction x, perpendicular to the scanning direction, exposure variations may be limited. For example, it may be required that the maximum exposure Emax and the minimum exposure Emin in the range x1<x<x2 are bounded with the following relationship:

$$\left(\frac{E\max - E\min}{E\max + E\min}\right) < 0.05$$

This may be achieved with a highly uniform beam. Alternatively, as shown in FIG. 8, a beam may be applied having a footprint extending beyond the boundaries of the recessed area 111, which is sufficiently uniform within these boundaries. When using a pulsed laser, the pulse frequency should be sufficiently high to uniformly heat the functional material, for example a frequency of 100 kHz or higher. A continuous wave laser can also be used where the timed release is controlled by the scan speed.

As noted with reference to FIG. 6, precautions can be taken to reduce the risk that functional material accidently is transferred as result of exposure of the plate by the beam in areas outside the recessed areas.

Returning to FIG. 7, it is further shown therein that upon completion of the deposition process in step S4, S5, recessed areas of the carrier plate can be refilled with functional material in step S3, so that the carrier plate is ready for reuse. Optionally, the carrier plate, in particular its first surface may be cleaned in an additional step S6 before refilling in step S3.

Figure 9A:
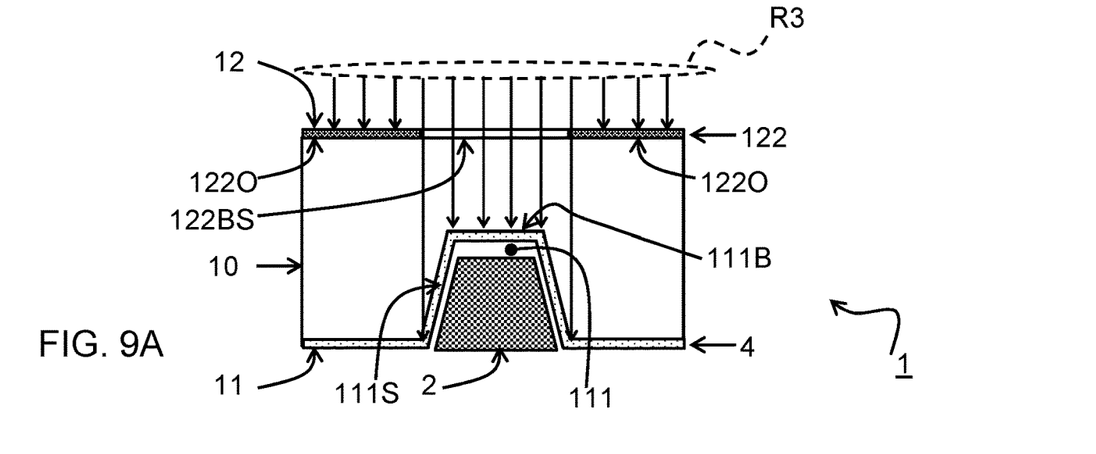
FIG. 9A-9C show alternative embodiments of the plate as claimed herein.
Figure 9B:
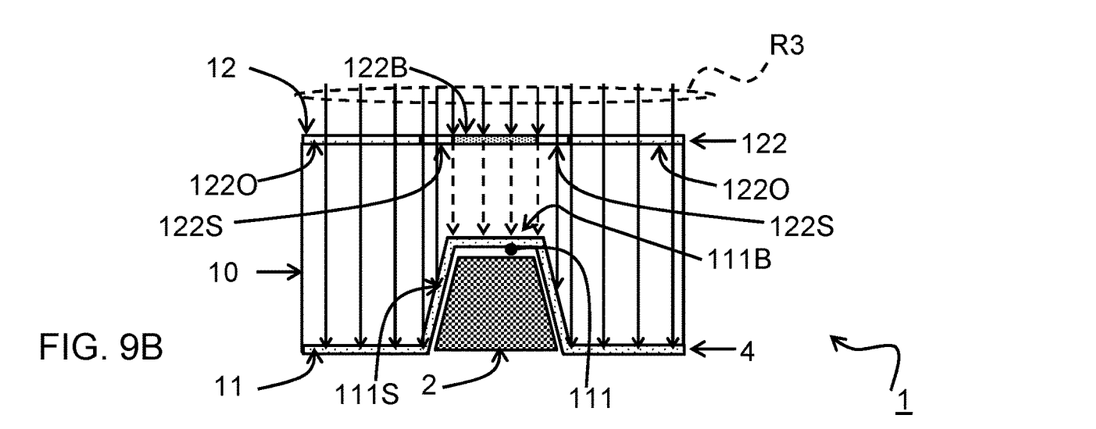
Figure 9C:
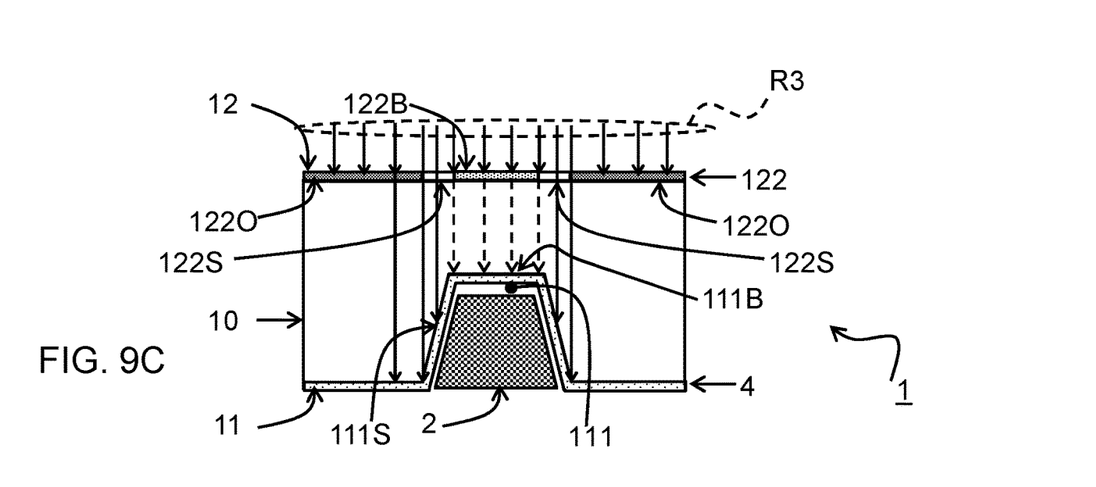

FIG. 9A-9C show further embodiments of a transparent carrier plate 1. Parts therein corresponding to those in FIG. 2 and FIG. 6 have the same reference number. For clarity, the dielectric coating 4 is shown without further detail. The dielectric coating 4 at the first surface 11 may for example have a stack of dielectric coating layers 41, 42, 43 as shown in more detail in FIG. 3A, 3B and described above with reference to FIGS. 3A, 3B, 4 and 5. Also other layers may be provided such as a protective coating. In the embodiments shown in FIG. 9A-9C, the transparent carrier plate 1 is additionally provided with a gray-scale mask 122 to control a heat flux of the monochromatic photon radiation R3.

In the example shown in FIG. 9A, gray-scale mask 122 has a transparent first zone 122BS which corresponds to an area defined by the recessed areas 111. The gray-scale mask 122 has second opaque zones 122O complimentary thereto. Upon exposure of the plate 1 to radiation R3, the portion of the radiation incident at the transparent first zone 122BS is transmitted towards the dielectric coating 4 in the recessed area 111, with which it is achieved that a transmitted heat-flux in the surface of the side wall 111S and a transmitted heat-flux in the surface of the bottom wall 111B have substantially the same magnitude.

In the example shown in FIG. 9B, gray-scale mask 122 has a central zone 122B corresponding to the surface area of the bottom wall 111B of the recessed area 111, a boundary zone 122S corresponding to the surface area of the side wall 111S of the recessed area 111 and a complementary zone 122O. In this example the gray-scale mask 122 is provided to control a heat flux of the monochromatic photon radiation R3 to cooperate with the dielectric coating 4 to provide for an at least substantially homogeneous transmitted heat flux at the inner surface of the one or more recessed areas 111. Therewith an additional degree of freedom is available. For example if recesses with side walls with mutually different slanting angles are provided therein, the gray-scale mask 122 can be designed to achieve the at least substantially homogeneous transmitted heat flux, even if the dielectric coating would not be capable to provide the proper compensation for the full range of side wall angles. For example in case the plate provided with the coating described with reference to FIG. 4 comprises in addition to recesses with a wall angle of 70 degrees also recesses with a wall angle of 45 degrees or 80 degrees. In the example shown in FIG. 9B, the central zone 122B for example has a transmissivity of 60% and the boundary zone 122S has a transmissivity of approximately 100%. In that case for a recession with a side wall at an angle of 80 degrees, using the coating described with reference to FIG. 4, a substantially homogeneous transmitted heat flux would be available over the inner surface of the recession. In the example of FIG. 9B, the transmissivity of the complementary zone 122O is also approximately 100%.

In the example shown in FIG. 9C, the gray-scale mask 122 combines the functionalities provided in the examples of FIGS. 9A and 9B.

The invention claimed is:

1. A plate configured to deposit a functional material onto a target surface using monochromatic radiation having a wavelength, the plate comprising:
    a substrate with a first surface to be directed towards the target surface and with a second surface to receive the monochromatic radiation,
    wherein the first surface is patterned with one or more recessed areas having a dielectric coating,
    wherein one or more of the recessed areas are configured to be filled with the functional material, and
    wherein the dielectric coating comprises a sequence of dielectric coating layers alternating in refractive index, the dielectric coating having a relatively high reflectivity for the monochromatic radiation incident perpendicular to the dielectric coating in comparison to a reflectivity for the monochromatic radiation incident at an angle of 45 degrees to the dielectric coating.

2. The plate according to claim 1, wherein the dielectric coating layers have a thickness in a range of 0.05 to 0.15 times the wavelength of the monochromatic radiation.

3. The plate according to claim 1, wherein the dielectric coating covers the first surface in a blanketwise manner.

4. The plate according to claim 1, wherein the dielectric coating is covered with a protective layer.

5. The plate according to claim 1, wherein non-recessed portions of the first surface are provided with a reflective coating that substantially reflects the monochromatic radiation.

6. The plate according to claim 1, comprising at least in the one or more recessed areas a photon radiation absorbing layer between the dielectric coating and the functional material.

7. The plate according to claim 1, being provided at its second surface with a gray-scale mask to control a heat flux of the monochromatic radiation to cooperate with the dielectric coating to provide for an at least substantially homogeneous transmitted heat flux at the inner surface of the one or more recessed areas and/or to suppress transmission of the radiation outside these areas.

* * * * *